US007886201B2

(12) United States Patent
Shi et al.

(10) Patent No.: US 7,886,201 B2
(45) Date of Patent: Feb. 8, 2011

(54) DECODER ARCHITECTURE FOR OPTIMIZED ERROR MANAGEMENT IN STREAMING MULTIMEDIA

(75) Inventors: Fang Shi, San Diego, CA (US); Vijayalakshmi R. Raveendran, San Diego, CA (US); Seyfullah Halit Oguz, San Diego, CA (US); Sumeet Singh Sethi, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 880 days.

(21) Appl. No.: 11/373,548

(22) Filed: Mar. 10, 2006

(65) Prior Publication Data

US 2006/0282737 A1    Dec. 14, 2006

Related U.S. Application Data

(60) Provisional application No. 60/660,681, filed on Mar. 10, 2005, provisional application No. 60/660,923, filed on Mar. 10, 2005, provisional application No. 60/660,867, filed on Mar. 10, 2005.

(51) Int. Cl.
*G06F 11/00* (2006.01)
(52) U.S. Cl. ...................................................... 714/52
(58) Field of Classification Search ................... 714/52, 714/753
See application file for complete search history.

(56) References Cited

U.S. PATENT DOCUMENTS 5,241,546 A * 8/1993 Peterson et al. ............. 714/761
RE34,810 E * 12/1994 Lemaine et al. ............. 348/472
5,504,732 A * 4/1996 Gregg et al. ............. 369/53.27
5,633,870 A   5/1997 Gaytan et al.
5,878,217 A   3/1999 Cherukuri (Continued)

FOREIGN PATENT DOCUMENTS

CL          8571995       6/1995

(Continued)

OTHER PUBLICATIONS

Belfiore S et al, "Spatiotemporal error concealment with optimized mode selection and application to H.264," Signal Processing. Image Communication, Elsevier Science Publishers, Amsterdam, NL, vol. 18, No. 10, Nov. 2003, pp. 907-923.

(Continued)

*Primary Examiner*—Bryce P Bonzo

(57) ABSTRACT

A method and apparatus for multi-layer integration for use in error recovery is disclosed. An error is detected in a multimedia data based on a first layer protocol and the detected error in the multimedia data is concealed based on a second layer protocol. In one aspect, the error in a multimedia data is detected based on a communication layer protocol and controlled based on a transport layer protocol. An error distribution of the controlled error is then determined based on a sync layer protocol and the detected error in the multimedia data is concealed based on an application layer protocol. In another aspect, a method and apparatus for multimedia data processing comprises error recovery as well as scalability. Finally, a method and apparatus as disclosed allows processing of multimedia stream by receiving multiple streams of encoded multimedia data, performing error recovery on an erroneous portion of a stream, and reconstructing the multimedia data from the multiple streams.

45 Claims, 8 Drawing Sheets

U.S. PATENT DOCUMENTS

| | | | |
|---|---|---|---|
| 6,335,985 | B1 | 1/2002 | Sambonsugi et al. |
| 6,490,705 | B1 * | 12/2002 | Boyce .................... 714/776 |
| 6,516,441 | B1 * | 2/2003 | Kim et al. .................... 714/774 |
| 6,530,055 | B1 | 3/2003 | Fukunaga |
| 6,553,540 | B1 | 4/2003 | Schramm et al. |
| 6,804,494 | B2 | 10/2004 | Fernandez-Corbaton et al. |
| 7,180,843 | B2 | 2/2007 | Furuta et al. |
| 7,197,692 | B2 | 3/2007 | Sutivong et al. |
| 7,450,610 | B2 | 11/2008 | An |
| 2002/0063807 | A1 * | 5/2002 | Margulis .................... 348/745 |
| 2003/0215014 | A1 | 11/2003 | Koto et al. |
| 2003/0227851 | A1 | 12/2003 | Furuta et al. |
| 2004/0071354 | A1 | 4/2004 | Adachi et al. |
| 2005/0030207 | A1 | 2/2005 | Craven et al. |
| 2005/0129128 | A1 * | 6/2005 | Chou et al. ............ 375/240.18 |
| 2005/0135308 | A1 | 6/2005 | Vijayan et al. |
| 2005/0141475 | A1 | 6/2005 | Vijayan et al. |
| 2005/0163211 | A1 * | 7/2005 | Shanableh .............. 375/240.1 |
| 2005/0275573 | A1 | 12/2005 | Raveendran |
| 2006/0013320 | A1 | 1/2006 | Oguz et al. |
| 2006/0093031 | A1 * | 5/2006 | Van Der Schaar et al. .................... 375/240.01 |
| 2006/0146934 | A1 * | 7/2006 | Caglar et al. ........... 375/240.12 |
| 2006/0215539 | A1 | 9/2006 | Vrcelj et al. |
| 2006/0215761 | A1 | 9/2006 | Shi et al. |
| 2006/0218472 | A1 | 9/2006 | Dahl et al. |
| 2006/0222078 | A1 | 10/2006 | Raveendran |
| 2006/0230162 | A1 | 10/2006 | Chen et al. |
| 2006/0233239 | A1 | 10/2006 | Sethi et al. |
| 2007/0089021 | A1 | 4/2007 | Younkin et al. |

FOREIGN PATENT DOCUMENTS

| | | |
|---|---|---|
| CL | 1141996 | 1/1996 |
| CL | 19362000 | 7/2000 |
| EP | 0752801 A2 | 1/1997 |
| EP | 1301044 | 4/2003 |
| EP | 1484867 A2 | 12/2004 |
| JP | 62002747 | 1/1987 |
| JP | 06046020 | 2/1994 |
| JP | 09128315 | 5/1997 |
| JP | 09247681 | 9/1997 |
| JP | 2001510007 T | 7/2001 |
| JP | 2004364257 | 12/2004 |
| JP | 2005518142 | 6/2005 |
| KR | 20030058472 | 7/2003 |
| KR | 20040076428 | 9/2004 |
| RU | 2219671 | 1/2001 |
| WO | WO9950963 | 10/1999 |
| WO | WO03069834 A1 | 8/2003 |
| WO | WO2004062133 | 7/2004 |
| WO | WO2005022811 | 3/2005 |
| WO | 2005107421 A2 | 11/2005 |

OTHER PUBLICATIONS

Bansal P et al, "Improved error detection and localization techniques for mpeg-4 video," Proceedings 2002 International Conference on Image Processing. ICIP 2002. Rochester, NY, Sep. 22-25, 2002, International Conference on Image Processing, New York, NY: IEEE, US., vol. 2 of 3, Sep. 22, 2002, pp. 693-696.

Aign S et al., "Temporal & Spatial Error Concealment Techniques for Hierarchical MPEG-2 Video Codec," Communications—Gateway to Globalization. Proceedings of the Conference on Communications. Seattle, Jun. 18-22, 1995, Proceedings of the Conference on Communications, New York, IEEE, US, vol. 3, Jun. 18, 1995, pp. 1778-1783.

Sun H et al., "Error concealment algorithms for robust decoding of MPEG compressed video," Signal Processing. Image Communication, Elsevier Science Publishers, Amsterdam, NL, vol. 10, No. 4, Sep. 1997, pp. 249-268.

International Search Report—PCT/US2006/008763—International Search Authority, European Patent Office-Mar. 13, 2007.

International Preliminary Report of Patentability- PCT/US2006/008763, International Search Authority—The International Bureau of WIPO, Geneva, Switzerland—Sep. 12, 2007.

Written Opinion—PCT/US2006/008763, International Search Authority-European Patent Office- Mar. 13, 2007.

"Al-Mualla, ""Multiple-Reference Temporal Error Concealment,"" ISCAS 2001, Proceedings of the 2001 IEEEInternational Symposium on Circuits and Systems, Sydney, Australia, May 2001, IEEE International Symposium on Circuits and Systems, New York, NY, USA, vol. 1, May 2001, pp 149-152. XP010542054".

"Suh et al., ""Recovery of Motion Vectors for Error Concealment,"" TENCON 99, Proceedings of the IEEERegion 10 Conference, Cheju Island, South Korea, Sep. 1999, IEEE vol. 1, pp. 750-753, XP010368320".

European Search Report - EP08018818, Search Authority - Munich Patent Office - Jan. 29, 2009.

Yasuichi Okabe,: "Chapter 3. OSI Reference Model, 4. Session Layer, Presentation Layer and Application Layer," Network Technology Seminar, Detailed Explanation of TCP/IP Protocol, Itmedia Inc., Jul. 19, 2000, URL:http://www.atmarkit.co.jp/fwin2k/network/tcpip003/tcpip05.html.

* cited by examiner

DECODER ARCHITECTURE FOR OPTIMIZED ERROR MANAGEMENT IN STREAMING MULTIMEDIA

CLAIM OF PRIORITY UNDER 35 U.S.C. §119

The present Application for Patent claims priority to Provisional Application No. 60/660,681 entitled "Method and Apparatus for Error Recovery in Video Communications" filed Mar. 10, 2005, Provisional Application No. 60/660,923 entitled "A Method And Apparatus For Video Decoding" filed Mar. 10, 2005, and Provisional Application No. 60/660,867 entitled "Method Of Error Recovery For A Decoder" filed Mar. 10, 2005, all of which are assigned to the assignee hereof and hereby expressly incorporated by reference herein.

BACKGROUND

1. Field

This invention relates to methods and apparatus for decoding real-time streaming media on handheld devices.

2. Background

Due to the explosive growth and great success of the Internet and wireless communication, as well as increasing demand for multimedia services, streaming media over the Internet and mobile/wireless channels has drawn tremendous attention. In heterogeneous Internet Protocol (IP) networks, video is provided by a server and can be streamed by one or more clients. Wired connections include dial-up, integrated services digital network (ISDN), cable, digital subscriber line protocols (collectively referred to as xDSL), fiber, local area networks (LAN), wide area networks (WAN) and others. The transmission mode can be either uni-cast or multi-cast.

Similar to the heterogeneous IP network is mobile/wireless communication. Transport of multimedia content over mobile/wireless channels is very challenging because these channels are often severely impaired due to multi-path fading, shadowing, inter-symbol interference, and noise disturbances. Some other reasons such as mobility and competing traffic also cause bandwidth variations and loss. The channel noise and the number of users being served determine the time-varying property of channel environments.

The demands of higher data rates and higher quality of service in both heterogeneous IP networks and mobile communication systems are growing rapidly. However, factors such as limited delay times, limited transmit power, limited bandwidth and multi-path fading continue to restrict the data rates handled by practical systems. In multimedia communications, particularly in error-prone environments, error resilience of the transmitted media is critical in providing the desired quality of service because errors in even a single decoded value can lead to decoding artifacts propagating spatially and temporally. Various encoding measures have been used to minimize errors while maintaining a necessary data rate, however all of these techniques suffer from problems with errors arriving at the decoder side.

Through the use of a source encoder, data is compressed—conveying the maximum information by expending the minimum number of bits, followed by a channel encoder that tends to maximize the capacity of the transmission channel for a given probability of error in receiving these bits.

Channel coding, for example, Reed-Solomon coding, is used to improve the robustness of the source-coded data. Joint source-channel coding methodologies have been used to provide varying levels of error protection to source coded data with varying levels of importance or to enable rate adaptation of coded video data to available network bandwidth through partitioning and dropping packets. This is because the common transport protocols do not deliver corrupted data to the source decoder.

Source coding techniques such as reversible variable length coding (e.g. in MPEG-4) have been used for error recovery by decoding the packet in the reverse order when corrupt packets are in fact received. There is a compromise in coding efficiency with source coding techniques, which translates to quality of decoded video for a given bit rate.

Hybrid coding standards, such as MPEG-1, MPEG-2, MPEG-4 (collectively referred to as MPEG-x), H.261, H.262, H.263, and H.264 (collectively referred to as H.26x), use resynchronization points in the bitstream as the main method of handling errors at the decoder.

Another reason that may cause data loss in excess of the initial corruption is due to incorrect codeword emulation. The identification of the initial bit error position is not a trivial task and typically is not possible without a special design supporting the identification of bit error positions in a MAC layer or physical layer component. Hence, upon detecting bitstream corruption, the decoder may have to stop decoding and move forward in the bitstream to find the next resynchronization point, and in the process necessarily skipping a sizeable amount of potentially healthy data. Although emulation of a different codeword, which is the same length as the original, i.e. authentic, codeword might seem to be less of a problem with respect to the sequence of events described above, this is actually not the case. There are many ways in which this kind of an error may lead to failures in a decoder's correct bitstream interpretation. For example, in most current codecs there are objects in the bitstream (compression related parameters) whose values influence the syntax of the following portion of the bitstream. Hence, an incorrect value for such an object may lead to an incorrect bitstream interpretation.

Because the common transport protocols do not deliver corrupted data to the decoder (e.g., a video or audio decoder application), the decoder has a limited ability to handle bit errors, with dropping of packets and resynchronization being the most common solution. An improved method of handling bit errors that lead to error propagation and data loss due to problems such as synchronization loss and incorrect codeword emulation, is needed.

SUMMARY

In one aspect, a method and apparatus for multi-layer integration for use in error recovery comprises method or means for detecting an error in a multimedia data based on a first layer protocol; and concealing the detected error in the multimedia data based on a second layer protocol. In another aspect, an apparatus for multi-layer integration for use in error recovery, comprises a detector to detect an error in a multimedia data based on a first layer protocol; and a concealer to conceal the detected error in the multimedia data based on a second layer protocol. In the method and apparatus for multi-layer integration, the first layer may comprise a communication layer. The communication layer may comprise either one or a combination of a physical layer, a MAC layer and a transport layer. Moreover, the method and apparatus may further comprise method or means for controlling the detected error based on a transport layer protocol. Controlling the detected error may comprises localizing the detected error. The method and apparatus may also further comprise method or means for determining an error distribution of the detected error based on a sync layer protocol. The second layer may comprise an application layer.

In another aspect, a method and apparatus for multi-layer integration for use in error recovery comprises method or means for detecting an error in a multimedia data based on a communication layer protocol; controlling the detected error based on a transport layer protocol; determining an error distribution of the controlled error based on a sync layer protocol; and concealing the detected error in the multimedia data based on an application layer protocol. In still another aspect, a method and apparatus for use in multimedia data processing comprises method or means for performing error recovery of an encoded multimedia data; and supporting scalability of the encoded multimedia data. In yet another aspect, an apparatus for use in multimedia data processing comprises an error recovery component to perform error recovery of an encoded multimedia data; and a scalability component to support scalability of the encoded multimedia data. In the method and apparatus for use in multimedia processing, the scalability may comprise either one or both spatial and temporal scalability. The error recovery may comprise either one or a combination of temporal error concealment, spatial error concealment and frame rate up conversion.

In a further aspect, a method and apparatus for use in multimedia stream processing comprises method or means for receiving multiple streams of encoded multimedia data; performing error recovery on an erroneous portion of a stream; and reconstructing the multimedia data from the multiple streams. In still a further aspect, an apparatus for use in multimedia stream processing comprises a receiver to receive multiple streams of encoded multimedia data; an error recovery component to perform error recovery on an erroneous portion of a stream; and a reconstructor to reconstruct the multimedia data from the multiple streams. In the method and apparatus for use in multimedia stream processing, the error recovery may comprise either one or a combination of temporal error concealment, spatial error concealment and frame rate up conversion.

It should be noted that the above method and apparatus may be implemented by a computer readable medium and/or a processor configured to carry out the method or the operation of the apparatus.

DETAILED DESCRIPTION

A method and apparatus to provide improved error recovery capabilities in a multimedia decoder is described. Integrated error recovery capabilities are provided, such as, for example, detecting an error in a multimedia data stream at an upper layer (e.g., a communication layer) and performing error recovery on the detected error at an application layer (e.g., a video or audio decoder). In one example, a decoder architecture is presented that provides corrupt bit flagging information to application components for use in making informed decisions in performing various types of error recovery techniques. The error recovery techniques are used to replace corrupt symbols with estimated symbols that are obtained from information available to the application component, such as previously decoded video, audio, text, and graphics information. In the following description, specific details are given to provide a thorough understanding of the embodiments. However, it would be understood by one of ordinary skill in the art that the embodiments may be practiced without these specific details. For example, electrical components may be shown in block diagrams in order not to obscure the embodiments in unnecessary detail. In other instances, such components, other structures and techniques may be shown in detail to further explain the embodiments. It is also understood by skilled artisans that electrical components, which are shown as separate blocks, can be rearranged and/or combined into one component.

It is also noted that some embodiments may be described as a process, which is depicted as a flowchart, a flow diagram, a structure diagram, or a block diagram. Although a flowchart may describe the operations as a sequential process, many of the operations can be performed in parallel or concurrently and the process can be repeated. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Figure 1A:
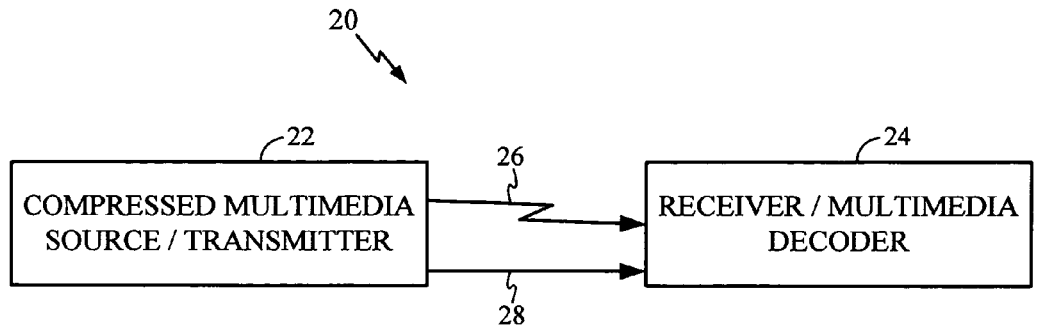
FIG. 1A is a block diagram of an example of a communications system for delivering streaming multimedia.

FIG. 1A is a block diagram of an example of a communications system for delivering streaming multimedia. The system 20 includes a transmitter 22 and a receiver multimedia decoder 24. Transmitter 22 contains compressed multimedia data of various forms including, but not limited to, video, audio, graphics, text, and pictures. The data can be compressed video and audio as in the MPEG-x and H.26x standards, compressed audio as in the MPEG-4 AAC, MP3, AMR and G.723 audio or voice compression standards, or any other type of digital data.

Transmitter 22 acquires data from various sources including external memory, the Internet, and a live video and/or audio feed. Transmitter 22 also transmits (Tx) acquired data over a network. The network can be a wired network 28 such as telephone, cable, or fiber optic, or a wireless network 26. In the case of wireless communication systems, network 26 can comprise, for example, part of a code division multiple access (CDMA or CDMA2000) communication system or alternately, the system can be a frequency division multiple access (FDMA) system, an orthogonal frequency division multiple access (OFDMA) system, a time division multiple access (TDMA) system such as GSM/GPRS (General Packet Radio Service)/EDGE (enhanced data GSM environment) or TETRA (Terrestrial Trunked Radio) mobile telephone technology for the service industry, a wideband code division multiple access (WCDMA), a high data rate (1xEV-DO or 1xEV-DO Gold Multicast) system, or in general any wireless communication system employing a combination of techniques.

Decoder 24 contains means, such as a radio frequency antenna or a network connection, for receiving data over wireless network 26 and/or wired network 28. Decoder 24 may include multiple processors including any combination of a preprocessor (e.g., any type of central processor unit CPU such as an ARM), a digital signal processor (DSP), software, firmware, and hardware such as a video core, for distributing the demodulation and decoding tasks associated with received data. Decoder 24 also contains memory components for storing the received data and intermediate data in various stages of the demodulation/decoding process. In some embodiments, an ARM preprocessor performs less complex tasks including unpacking (removing side information such as headers and signaling messages) and demultiplexing a plurality of bitstreams including audio, video and others. The ARM preprocessor also performs bitstream parsing, error detection and concealment and variable length entropy decoding. In some such embodiments, the DSP performs expansion of VLC (variable length code) codewords, inverse zig-zag scan of video data to spatially locate pixel coefficients, inverse AC/DC prediction of pixel coefficients for MPEG-4 video (not a feature of H.264 due to context adaptive entropy coding), and audio decoding (e.g. MPEG-4 AAC, MP3, AMR or G.723). The video core may perform the more computationally complex tasks of video decoding comprising dequantization, inverse transformation, motion compensated prediction, and deblocking (a form of filtering to reduce edge artifacts between pixel block edges). One or more elements may be added, rearranged or combined to communications system 20. In the case of wired communications systems, network 26 can comprise, for example, part of an internet protocol (IP) based communications system with transport protocols such as Real-Time Transport Protocol (RTP) or Universal Datagram Protocol (UDP).

Figure 1B:
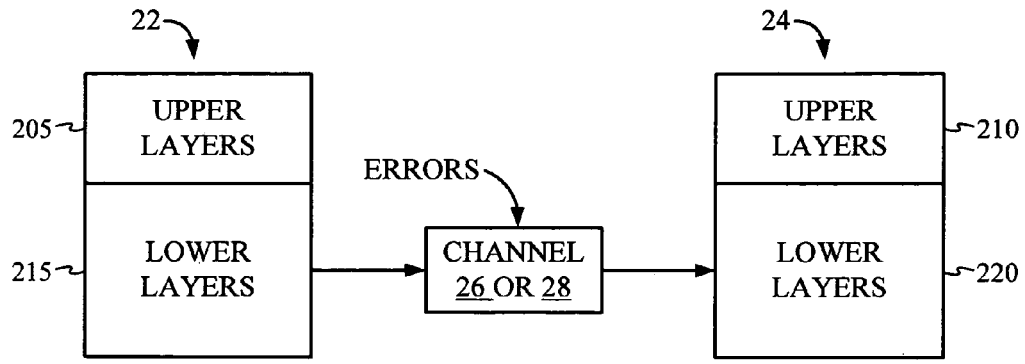
FIG. 1B is a block diagram of an example of a multilayered communications system for delivering streaming multimedia.

FIG. 1B is a block diagram of a multi-layer protocol stack used for dividing tasks in transmitter 22 and decoder 24. Upper layer components 205 and 210 in transmitter 22 and decoder 24, respectively, may include multiple applications such as, for example video or audio encoders and/or decoders. Some embodiments may include multiple streams of information that are meant to be decoded simultaneously. In these cases, synchronization tasks of the multiple streams may also performed in upper layer components 205 and 210. Upper layer component 205 may provide encoded timing information in the bitstream that is transmitted over wireless network 26 and/or wired network 28. Upper layer component 210 may parse the multiple streams of information such that the associated applications decode them at about the same time.

Lower layer components 215 in transmitter 22 may include various schemes to provide for error resiliency. Error prone channels such as wireless network 26 and/or wired network 28 may introduce errors into the bitstream received by decoder 24. Such error resiliency schemes provided in lower layer components 215 may include one or more error control coding schemes, interleaving schemes and other schemes that are known to those of skill in the art. Lower layer components 220 in decoder 22 may include the corresponding error decoding components that enable detection and correction of errors. Some errors that are introduced over wireless network 26 and/or wired network 28 may not be correctable by Lower layer components 220. For those errors that are not correctable, solutions such as lower layer components 220 requesting retransmission of corrupt components by lower layer components 215 of transmitter 22 may not be feasible for some situations, for example, in real-time multimedia communications such as streaming applications. In some embodiments, the lower layer components 215 and 220 comprise communications layer components. One or more elements may be added, rearranged or combined to transmitter 22 or decoder 24 shown in FIG. 1B.

Figure 1C:
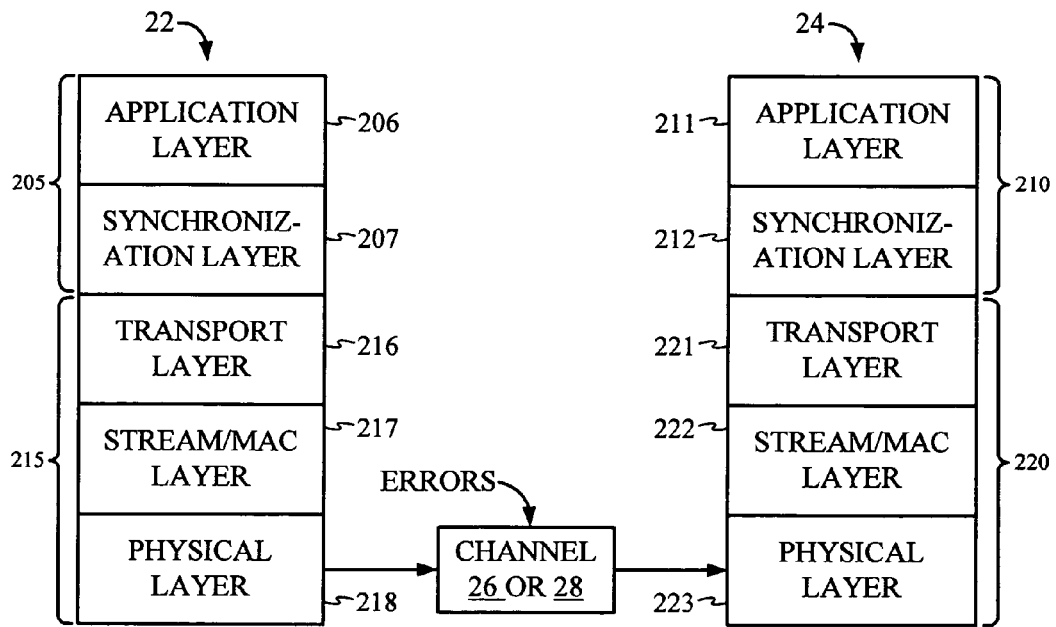
FIG. 1C is a block diagram of another example of a multilayered communications system for delivering streaming multimedia.

FIG. 1C is a block diagram of a more detailed example of a multi-layer protocol stack used for dividing tasks in transmitter 22 and decoder 24. Upper layer components 205, of transmitter 22, are distributed in one or more of an application layer 206 and a synchronization layer 207. Lower layer components 215, of transmitter 22, are distributed into one or more of a transport layer 216, a stream or medium access control (MAC) layer 217, and a physical layer 218. Similarly, Upper layer components 210, of decoder 24, are distributed in one or more of an application layer 211 and a synchronization layer 207. Lower layer components 220, of decoder 24, are distributed into one or more of a transport layer 221, a stream or medium access control (MAC) layer 222, and a physical layer 223. Those of skill in the art would recognize these layers and be familiar with the allocation of various tasks among them. An example of an architecture that integrates various layers of decoder device 24, as discussed above, to take advantage of the error resilience provided in transmitter 22, will now be discussed. One or more elements may be added, rearranged or combined to transmitter 22 or decoder 24 shown in FIG. 1C.

Figure 2A:
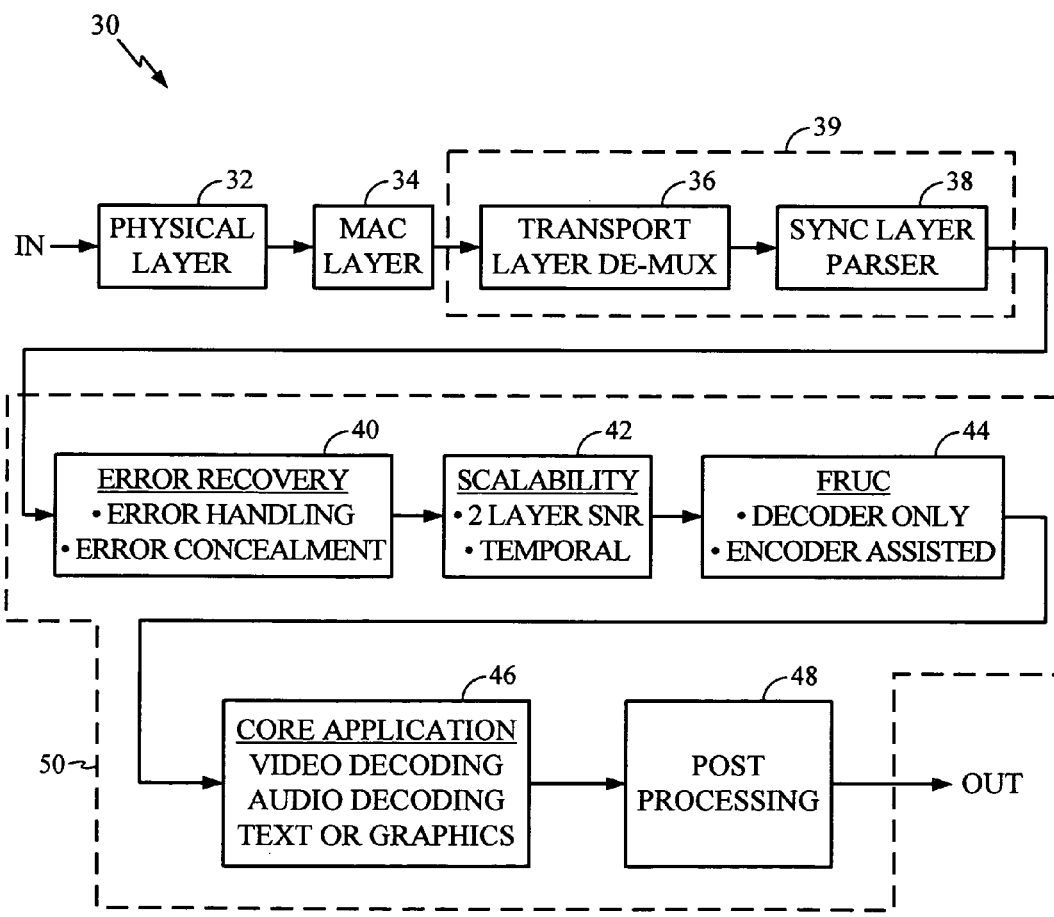
FIG. 2A is a block diagram of an example of a decoder device architecture for decoding streaming multimedia.
Figure 2B:
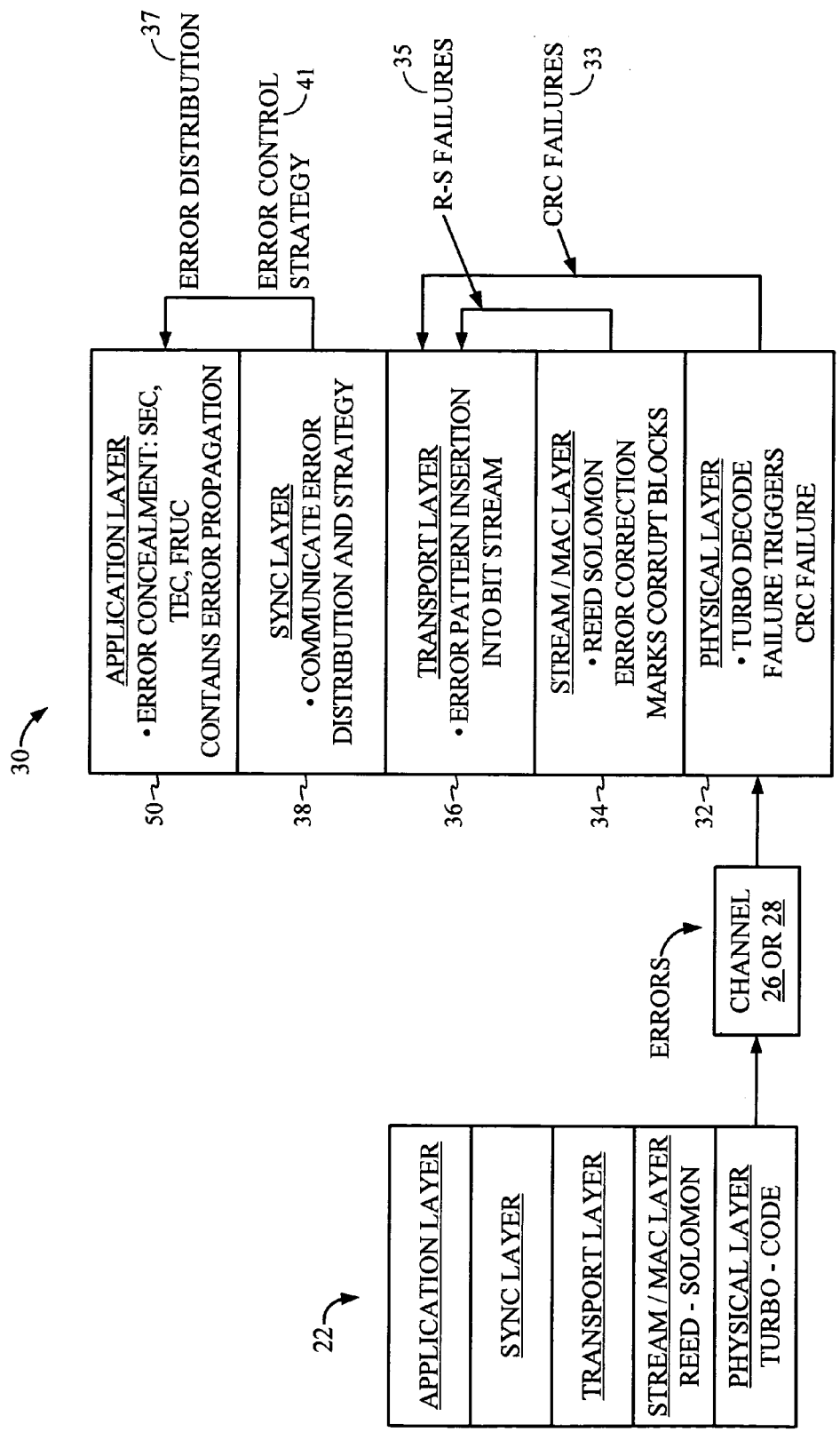
FIG. 2B is a protocol stack diagram of a multi-layer integrated management system that includes a transmitter and another view of the decoder device architecture of FIG. 2A.

FIG. 2A is a block diagram of an example of decoder device architecture for decoding streaming multimedia. FIG. 2B is a protocol stack diagram of an example of a multi-layer integrated management system that includes a transmitter 22 and a protocol stack view of the decoder device architecture of FIG. 2A. With reference to FIGS. 2A and 2B, multimedia decoder 30 includes physical layer component 32, MAC layer component 34, Transport and Sync. Parser (TSP) 39, and application layer component 50. Multimedia decoder 30 receives an input bitstream (IN) that includes a concatenated error correction scheme such as a Turbo/Reed-Solomon concatenated scheme. Physical layer component 32 may perform demodulation tasks including, but not limited to, receiving, error control decoding, e.g., turbo-code decoding, and interfacing with a MAC (medium access control) layer. MAC layer component 34 may perform error control decoding, e.g., Reed-Solomon error detection, error correction and flagging of uncorrectable corrupt data, e.g., groups of one or more bits. The MAC layer component 34 interfaces with Transport and Sync. Parser component (TSP) 39.

TSP component 39 may further include Transport Layer De-Mux component 36 and Sync. (synchronization) Layer Parser component 38. Transport Layer De-Mux component 36 may receive the bitstream passed from MAC layer component 34, including both correct and corrupt bits and information flagging the corrupt groups of bits. The corrupt groups of bits and the corresponding flagging information comprise information corresponding to Turbo-decoder CRC failures 33, and Reed-Solomon failures 35. (In certain protocol stacks, the Transport Layer De-Mux component 36 is also known as a Stream sub-layer, where the MAC sub-layer and the Stream sub-layer are both sub-layers of the Transport Layer.) Transport Layer De-Mux component 36 may demultiplex (De-Mux) or parse the bitstream it receives into a plurality of bitstreams. The parsed bitstreams can include bitstreams that are targeted to different applications such as a video decoder, audio decoder, and various combinations of text, graphics and image applications. The Transport Layer De-Mux component can also parse one bitstream targeted to a single application, such as the video bitstream for example, into two or more separate layers (e.g., using scalable coding) such as a base layer and an enhancement layer. These layers can then be used to provide scalability, e.g., temporal and/or SNR scalability. One example of scalable coding, divides Intra-coded pictures (such as I frames) and the different inter-coded pictures (such as P frames or B frames derived using, e.g., motion compensated prediction) into different layers in the bitstream. I frames may be encoded in a base layer and P and/or B frames may be encoded in an enhancement layer. Scalable coding, is useful in dynamic channels, where scalable bitstreams can be adapted to match fluctuations in network bandwidth. In error-prone channels, scalable coding can add robustness through unequal error protection of the base layer and the enhancement layer. Better error protection can be applied to the more important layer.

Sync. (synchronization) Layer Parser component 38 performs further parsing of the bitstream with respect to sub-bitstreams that are related to each other on a time-synchronous basis. A multi-media video bitstream can be parsed into a video bitstream, an audio bitstream and a bitstream with associated text for closed captioning. Sync. Layer Parser component 38 forwards the parsed bitstreams to the associated decoder application along with the time-synchronization information. This enables related audio, video and text to be displayed and played at the appropriate time.

In addition to the parsing discussed above, Transport Layer De-Mux component 36 may parse and forward the corruption flagging information (e.g., CRC failure information 33 and Reed-Solomon failure information 35), which it received from MAC Layer component 34 and Physical layer 32, to the Sync. Layer Parser component 38 and/or the appropriate application layer process (e.g., a video decoder, or an audio decoder). The Sync. Layer Parser component 38 may forward the corruption flagging information in the form of error distribution information 37. The Sync. Layer Parser component 38 may also forward recommended error control strategy information 41. The application layer process can then use the corruption flagging information 37 and control strategy information 41 for error handling.

Application layer component 50 may contain one or more components such as, for example, Error Recovery component 40, Scalability Component 42, Frame Rate Up Conversion (FRUC) component 44, Core Application Decoding component 46 and Post Processing Component 48. Application layer component 50 utilizes the forwarded corruption flagging information 37 and the control strategy information 41 to make decisions on how to utilize the Error Recovery, Scalability and FRUC components to manipulate the corrupt data thereby offering higher quality decoding with Core Application Decoding component 46. For example, in the case of temporal scalability where some media are received in one layer containing important information and the rest of the media in the other layer, FRUC can be used to reconstruct the missing media if the second layer was not received or was lost or corrupted. After decoding, Post Processing component 48 performs any necessary hardware specific modifications to enable display or playing or rendering of the video and audio output (OUT) on a video display or speakers respectively. Post processing component 48 may also perform enhancement or restoration operations before the media is rendered or presented.

Core Application Decoding component 46 can include a video decoder(s), an audio decoder(s) as well as text and graphics applications. By performing Error Recovery, Scalability and FRUC processing of the various application bitstreams prior or during decoding with Core Application component 46, enhancements can be made to improve the quality of a low quality bitstream (one encoded at a low quality or one received at a low quality due to errors). For example, components 40, 42 and 44 can offer enhancements to a standard baseline compliant H.264 video bitstream (the baseline profile is a very simple profile that was designed for low power devices) and provide certain features from the other profiles of H.264 such as B-frames and slice data partitioning that are required to meet scalability, acquisition and error resilience requirements for streaming video. Details of processes utilizing the components of multimedia decoder 30 are presented below. One or more elements may be added, rearranged or combined to transmitter 22 or decoder 30 shown in FIGS. 2A and 2B.

Figure 3:
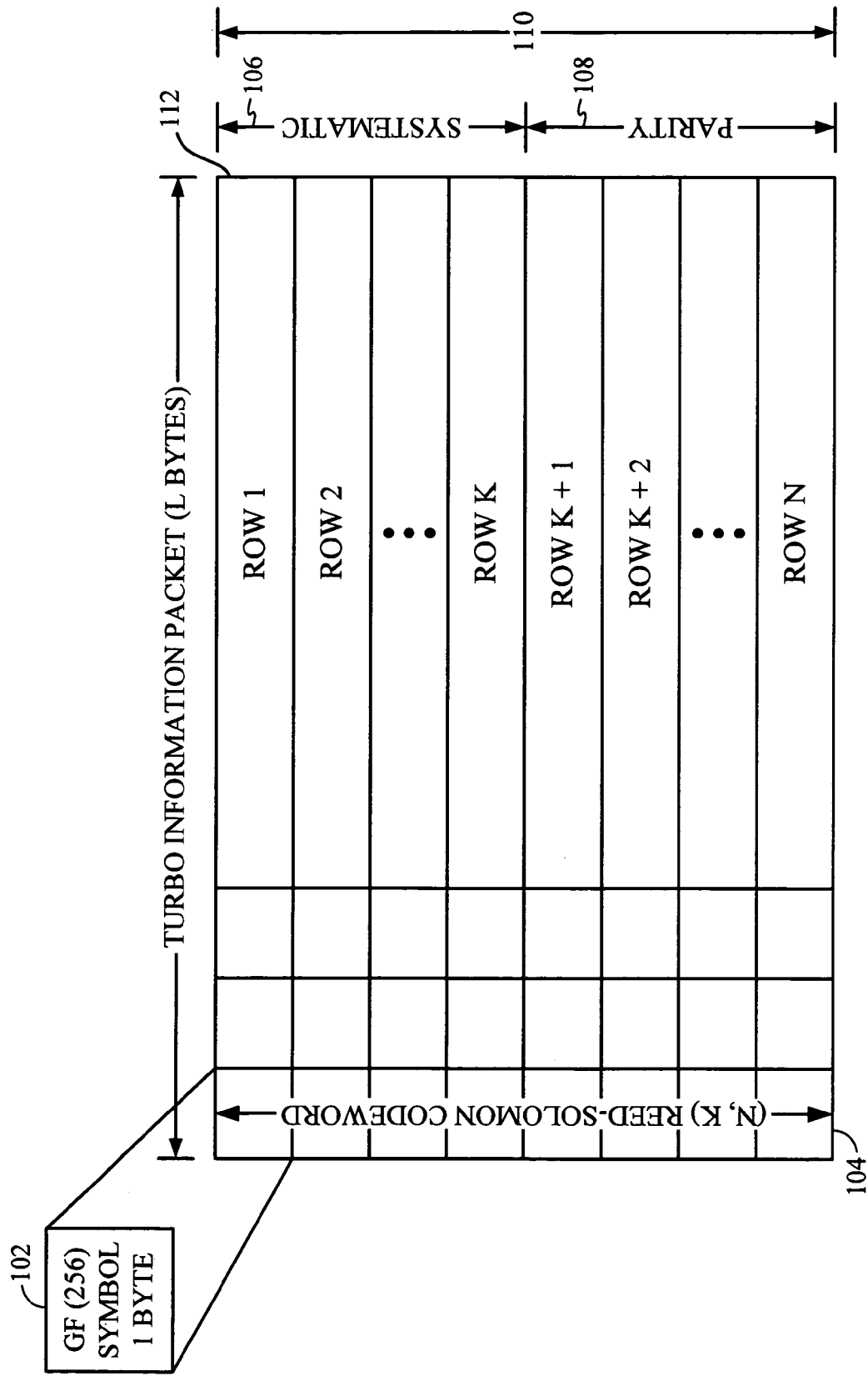
FIG. 3 depicts an example of multimedia symbols organized for concatenated Reed Solomon erasure and Turbo coding.

A brief discussion of error detection and error correction will now be presented. One example of an error detection and correction scheme uses a concatenated code including both an inner (channel) code and an outer (channel) code. The concatenated channel codes consist of a Turbo (inner) code in the physical layer and a Reed-Solomon (outer) erasure correcting code positioned in the transport/MAC layer. FIG. 3 depicts an example of multimedia symbols organized for concatenated Reed Solomon erasure and Turbo coding. With respect to the encoding side, symbols output from the information source, binary codewords output from an encoder, are blocked into bytes 102. Each byte 102 is considered a symbol in a finite field known as a "Galois Field (256)" for the purposes of an outer (N, K) Reed-Solomon (RS) code over GF(256). N and K respectively denote the sizes of the entire RS codeword 104 and its source data 106 holding systematic portion in number of symbols. Thus N−minus K gives the number of parity symbols 108 included in each codeword 104. An (N, K) RS code is capable of correcting N minus K erasures.

The top K rows 106 essentially hold the symbols output from the information source and these symbols can be scanned into the K rows in either rows-first or columns-first manner. The interleaving achieved by the columns-first scan, results in significantly shorter groups of corrupt bits when a given Turbo Information Packet row 112 is corrupt. The groups of corrupt bits, due to Turbo Information Packet erasure, may be 1 byte each in length for columns first scanning as opposed to (L-1) bytes each for rows first scanning. At the decoder, the flagging of these corrupt groups of bits, as discussed below, may need to identify the size and position (in the bitstream) of these bit groups. After this initial step of source data placement, each of the L columns 104 (of K bytes) is RS coded into N bytes, by adding N-K parity bytes, and hence, rows K+1, . . . , N 108 in FIG. 3 are generated. The top K rows, consisting of source data 106, are referred to as the RS information block, and the entire set of N rows is referred to as the RS encoded block, or simply code block 110.

Each row 112 is appended a CRC (Cyclic Redundancy Check) checksum and some trailing bits required for the correct operation of a turbo coder. By appending a checksum to each row 112, those rows failing to satisfy their respective checksums after turbo decoding may be declared erased. Each code block 110 is input one row 112 at a time into a turbo coder, and, hence, each row is referred to as a Turbo Information Packet.

The turbo decoding process presents hard-decision data to the Reed-Solomon decoding process, which further reduces the rate of residual errors. The ability to successfully correct for erasure depends on the total number of erasures within a code block and the number (N minus K) of parity symbols used per RS codeword.

In the channel coding design targeted for multimedia decoder 30 of FIG. 2, if the Reed-Solomon (RS) Code Block has erasures beyond the correction capacity, the corresponding RS Information Block (FIG. 3) may be passed to components in the transport layer, sync. layer and finally the application layer with a joint notification flagging which of the K Turbo Information Packets 112 (FIG. 3) are corrupt. The systematic structure of the outer (N, K) RS Code over GF (256) enables the straightforward utilization of turbo information packets, which are correctly received (not corrupt).

Figure 4:
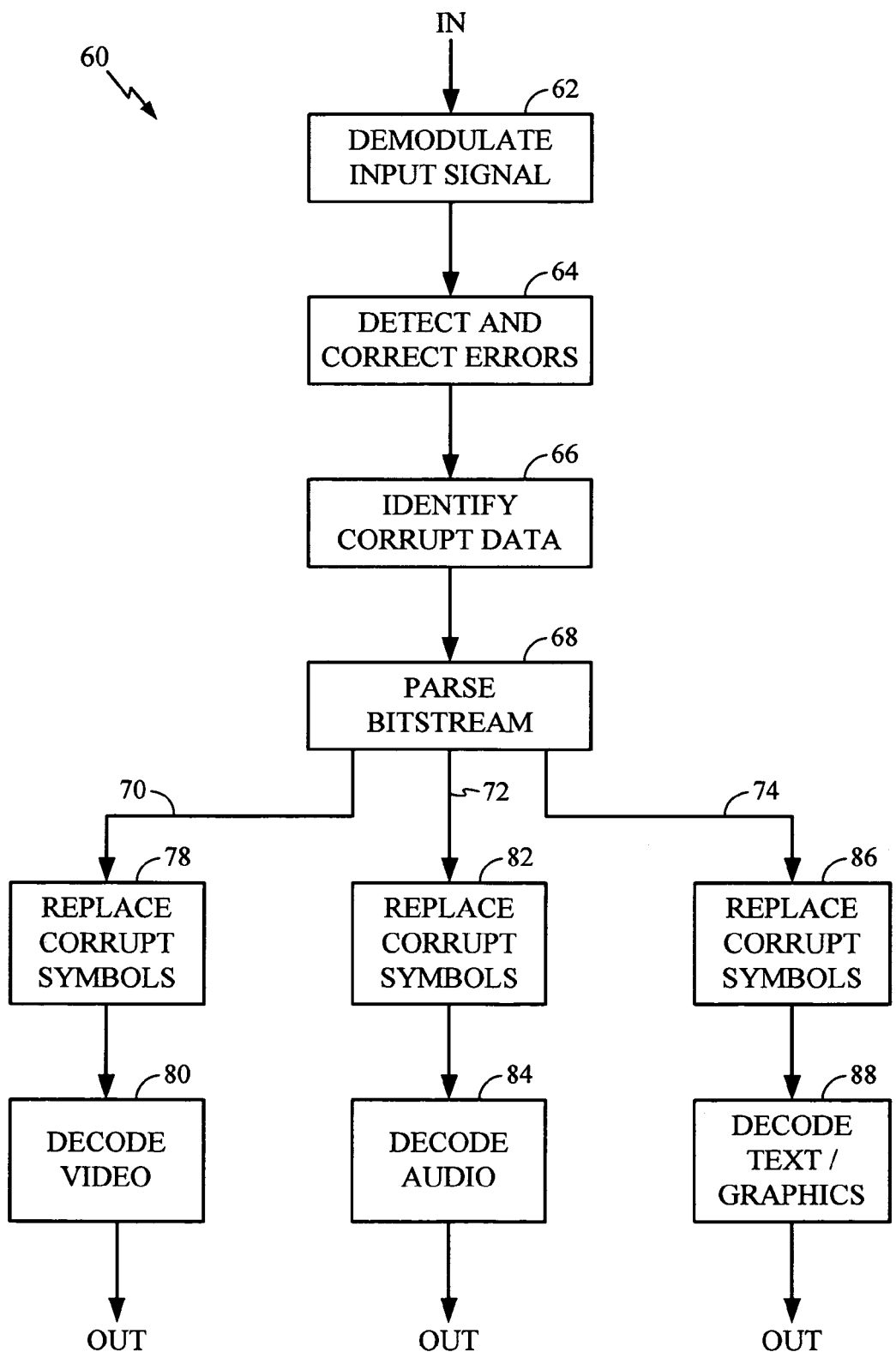
FIG. 4 is a flow diagram of an example of a method for decoding streaming multimedia.

FIG. 4 is a flow diagram of an example of a method for decoding streaming multimedia. Noisy modulated data (IN) is received and input to decoding process 60 and demodulated 62. The data can be received across wired or wireless networks such as wireless network 26 and wired network 28 in FIG. 1. Physical layer component 32 of FIG. 2 performs the act of demodulating the received noisy data at step 62. The demodulated data is then passed on where errors may be detected and corrected 64. Physical layer component 32 of FIG. 2 can perform the act of Turbo decoding of 64, while MAC Layer component 34 of FIG. 2 can perform the act of Reed Solomon Error correction of 64.

After Turbo and Reed Solomon decoding has detected and corrected 64 all errors that are correctable, Turbo Information Packets and/or corrupt bytes are identified 66, for example, by flagging. Before passing the bitstream on for parsing 68, the CRC checksums and trailing bits in each Turbo Information Packet, as well as the parity rows 108 (FIG. 3) are discarded. The correctly received, the incorrectly received but corrected, and the flagged corrupt data, along with the flagging information identifying the corrupt data, are all passed on for bitstream parsing 68. Physical layer component 32 and/or MAC Layer component 34 of FIG. 2 can perform the act of identifying (e.g., by flagging) 66 corrupt data.

As discussed above, Transport De-Mux component 36 and Sync. Layer Parser component 38 parse 68 the bitstream, into a plurality of bitstreams targeted for multiple application layer processes. In the example shown in FIG. 4, the bitstream is parsed 68 into video bitstream 70, audio bitstream 72 and text and/or graphics bitstream 74. Each bitstream 70, 72 and 74 can contain data identifying corrupt groups of bits within the individual bitstreams. In addition, when individual bitstreams are to be time synchronous, the bitstreams can contain timing information.

After the individual bitstreams are parsed, error handling takes place at the application layer where corrupt bits are replaced 78, 82 and 86, utilizing one of several techniques of error recovery or concealment. Error Recovery component 40, Scalability component 42 and FRUC component 44 of application layer component 50 in FIG. 2 can perform the acts of replacing 78, 82 and 86. After the corrupt symbols are replaced, the individual video, audio and text/graphics bitstreams can be decoded, 80, 84 and 88 respectively. Core Application component 46 of application layer component 50 in FIG. 2 can perform decoding 80, 84 and 88. The Core Application component 46 of application layer component 50 in FIG. 2 may also replace 78, 82 and/or 86 corrupt bits that may have been flagged by lower layer components. One or more elements may be added, rearranged or combined to process 60 shown in FIG. 4.

Figure 5:
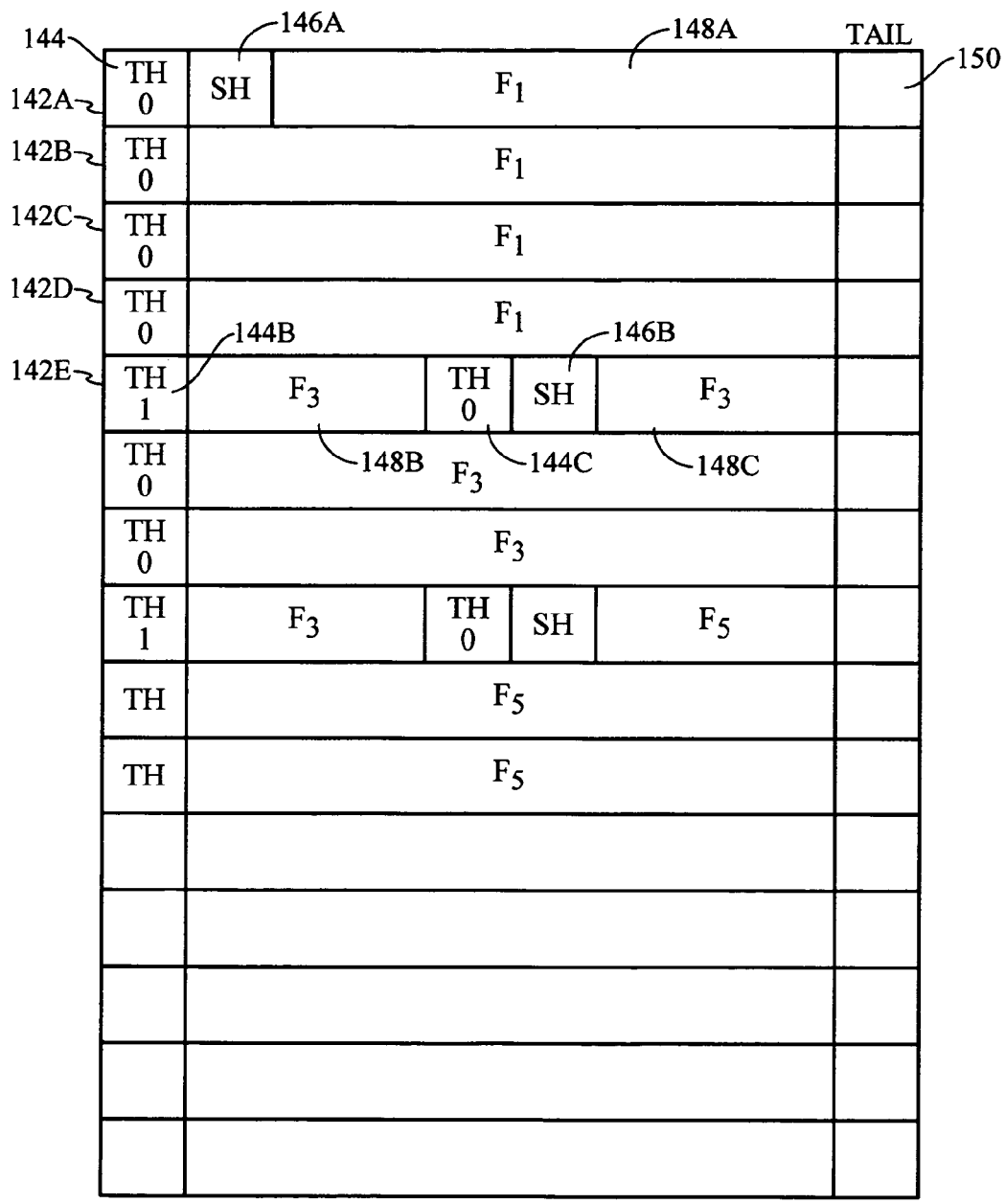
FIG. 5 depicts a Turbo Information Packet structure for video data.

An example of identifying 66 corrupt bits by flagging of corrupt data, as shown in FIG. 4, will now be discussed in more detail. FIG. 5 depicts a Turbo Information Packet structure for video data. Block 140 represents a set of Turbo Information Packets such as the K rows of Turbo Information Packets 106 making up the RS Information Block depicted in FIG. 3. A frame of video can require more than one Turbo Information Packet of data to be encoded. For Example, a first frame, F1, is started in row 142A in information block 148A. The remaining data in frame F1 is located in rows 142B, 142C, 142D and the first part of row 142E. Row 142A also contains Sync. header (SH) 146A which contains information such as stream identification, synchronization time, frame identification (frame number and possibly layer number in the case of a base layer and an enhancement layer), and other information. Sync. header 146A serves to identify to the Sync. Layer Parser (see 38 in FIG. 2) where (which application) to send the data contained in the following information blocks representing frame F1. At the end of each row is a CRC checksum, as discussed above, which is used in conjunction with Reed-Solomon decoding to identify erased (corrupt) packets.

At the beginning of each Turbo Information Packet row is transport layer header (TH) 144. Each TH 144 contains Last_Flag and an Offset_Pointer. Flagging of a corrupt Turbo Information Packet, carried out at state 66 of FIG. 4, can be done by the Offset_Pointer value itself. Setting the Offset_Pointer to an illegitimate value may signify the packet as being corrupt. Alternatively, an Error_Flag field may be used in the TH. Flagging can be accomplished by a setting (Error_Flag=1) in the corresponding TH. For Example, if row 142C is corrupt, then the TH of row 142C can be set equal to one. The Last_Flag is used to indicate that the current row is the last row of a Frame (by setting it equal to one, for example) and if it is the last row, then the Offset_Pointer is used to indicate where in the Turbo Information Packet Row the next frame starts (in number of bytes). In Row 142E, for example, TH 144B can have (Last_Flag=1) and Offset_Pointer can be equal to the number of bytes contained in the row prior to the start of TH 144C (the start of frame F3). Sync. Header 146B may contain data indicating the Frame_ID and bitstream as discussed above. Information block 148C contains video data representing frame F3. If Row 142E were determined to be corrupt. Then the decoder may not be able to determine where frame F1 ends and where frame F3 begins.

In addition to (or instead of) including an Error_Flag in the transport header as discussed above, a data table could be constructed and forwarded to the application layer with the information listed in Table 1 for each video frame.

TABLE 1

Sample Information Contained in a Video Bitstream Error Table

Frame Number - an integer number within a finite set of frames, 30 frames for example, where the numbering restarts at 1 after the highest number is reached.
B/E - Indicates the base or enhancement layer number of the frame in the case of multiple layer scalability.
Frame_Length - length of video frame in bytes.
RAP_Flag - a flag indicating if the Frame is a random access point, such as a fully intra-coded I-frame. Such a flag may also serves as a resynchronization point when errors are encountered.
Presentation Time Stamp (PTS) - a time in a sequence of frames when the frame is to be displayed.
Frames Per Second (FPS)
Number of Turbo Information Packets the frame occupies (both whole and partial)
Error_Bit_Pattern - a variable indicating which Turbo Information Packets are corrupt (the five bits '00100' would indicate that the third Turbo Information Packet out of five packets is corrupt.
Error_Ratio - a variable indicating the ratio of corrupt Turbo Information Packets to correct packets (1/5 would indicate one out of 5 packets is corrupt.

Other bitstream error tables, similar to Table 1, can be constructed. The error flagging information contained in the transport headers and/or error tables such as Table 1 may be utilized by the application layer components, such as components 40, 42 and 44 of FIG. 2, to identify corrupt symbols in the parsed bitstreams 70, 72 and 74 and replace them at steps 78, 82 and 86, respectively, in FIG. 4. As discussed above, erasure packets from RS coding are not discarded but handed up to the application layer, such as the video decoder. This prevents entire packets, potentially 122 bytes in length or more for video packets, from being lost.

The act of replacing corrupt symbols, steps 78 82 and 86 in FIG. 4, can take on two main forms, error correction and error concealment. Bitstream level error correction and concealment operations are carried out on erasures and burst errors. Decoding errors (due to byte errors) are corrected using MAP (Maximum a Posteriori Probability) criterion to the extent possible. Errors that cannot be corrected are concealed using spatial and/or temporal information from neighboring macroblocks (a macroblock is a 16×16 pixel region that is commonly operated on in video compression standards, but smaller sub-macroblocks such as 8×8, 8×16 and others, could also be used). Temporal concealment can be used, for example, when an image is static over more than one frame. If the corrupt macroblock being concealed is in a region that has remained relatively constant in previous frames, it is likely to be present in the corrupt frame and the past frame regions could be used as an estimate for the corrupt region. Spatial concealment can take advantage of edges or objects that persist over neighboring macroblocks within the same frame.

As discussed above, multiple layers of encoded data representing the same bitstream can be received. The layers can include a base layer and one or more enhancement layers where the enhancement layer(s) can provide extra frames that are not available in the base layer (such as bi-directional predicted B-frames), or they can provide higher quality differential refinements to the base layer pixel coefficients. In the case of differential refinements to base layer coefficients, if the base layer is corrupted, then the enhancement layer may be useless since it was derived based on the base layer pixel values. Thus, the enhancement layer can be omitted from decoding if the base layer data is corrupt. This process is called selective decoding and may also be used under low power scenarios. For example, when the device hosting the decoder is running on low power mode or running low on battery, only the base layer can be decoded omitting the enhancement layer thus saving compute cycles and in turn power consumption. Spatial and/or temporal concealment techniques can be used to replace the combined base plus enhancement layer data.

An enhancement layer (sometimes treated as a low priority layer) may be transmitted at a lower power than the base layer (or high priority layer). This increases the probability of error in enhancement layer over the base layer. Hence, when the received base layer contains a high percentage of errors, the enhancement layer can potentially be dropped.

Bi-directional predicted frames (B-Frames) are predicted from both a previous frame and a subsequent frame using motion compensated prediction. B-Frames offer very high compression ratios and are very desirable for conserving bandwidth. B-Frames are also desirable for their temporal scalability characteristics. Standards compliant B-Frames are not used for prediction of any other frames, and for this reason, they can be dropped without adversely affecting other frames. B-Frames are also more susceptible to error propagation due to errors in the frames that they depend on. For these reasons, B-Frames are very likely to be carried in an enhancement (or low priority) layer. If the enhancement layer is transmitted at a lower power, then the B-Frames is even more susceptible to errors.

If a B-Frame (or any other type of frame) is completely corrupt, or has an error percentage above a threshold making temporal or spatial error concealment unfeasible, then Frame Rate Up Conversion (see FRUC component 44 of FIG. 2) can be utilized. FRUC is used to re-generate the lost frame. FRUC can also be used to regenerate a frame that was skipped from decoding for reasons such as power savings. FRUC techniques utilize motion vector and pixel information from a previous frame and a subsequent frame to interpolate values for motion vectors and pixels. The exact FRUC techniques are beyond the scope of this discussion. FRUC techniques include decoder-only and encoder-assisted forms. Decoder-only FRUC performs the pseudo-interpolation of frame data without any other information. Encoder-assisted FRUC utilizes side information transmitted in Supplemental Enhancement Information (SEI) messages of H.264 or the user_data message of MPEG-2.

Figure 6:
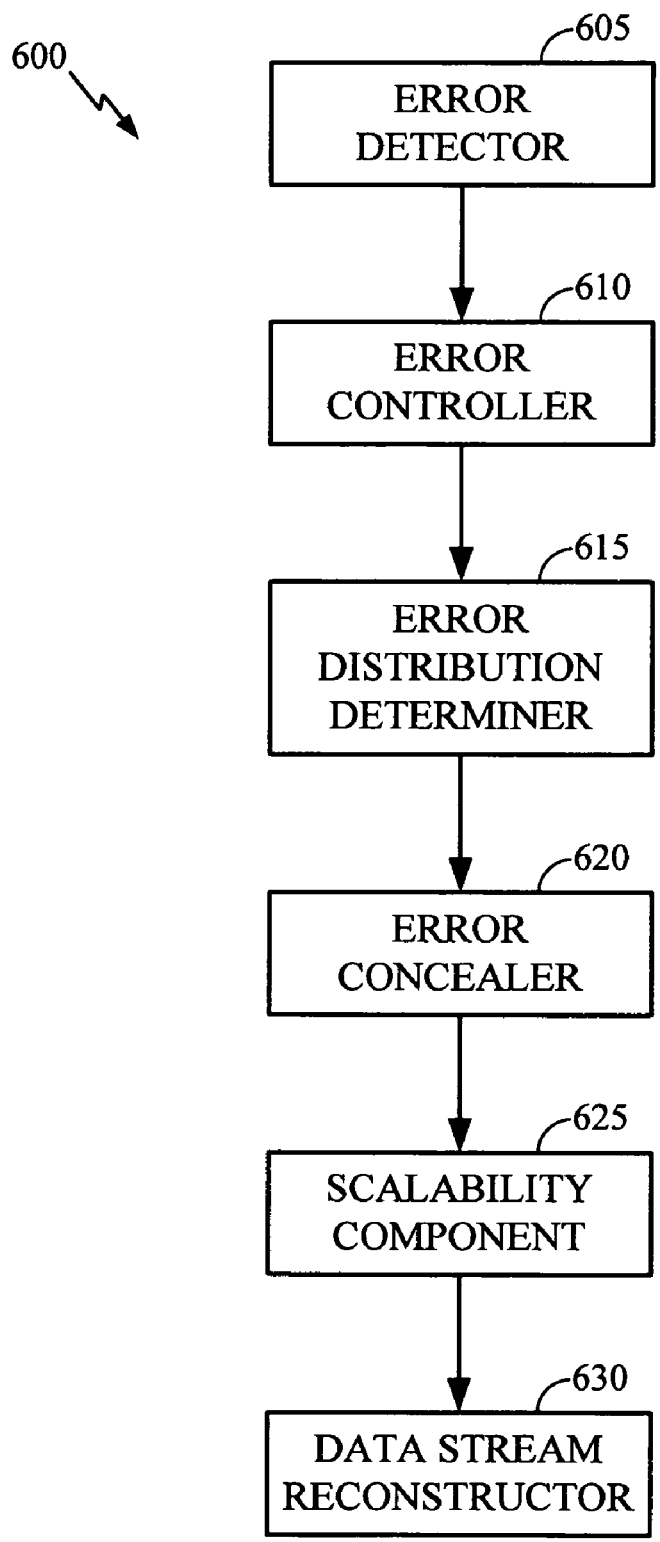
FIG. 6 shows a block diagram of an example system of components that may be part of a multimedia receiver 24 as shown in FIG. 1.
Figure 7:
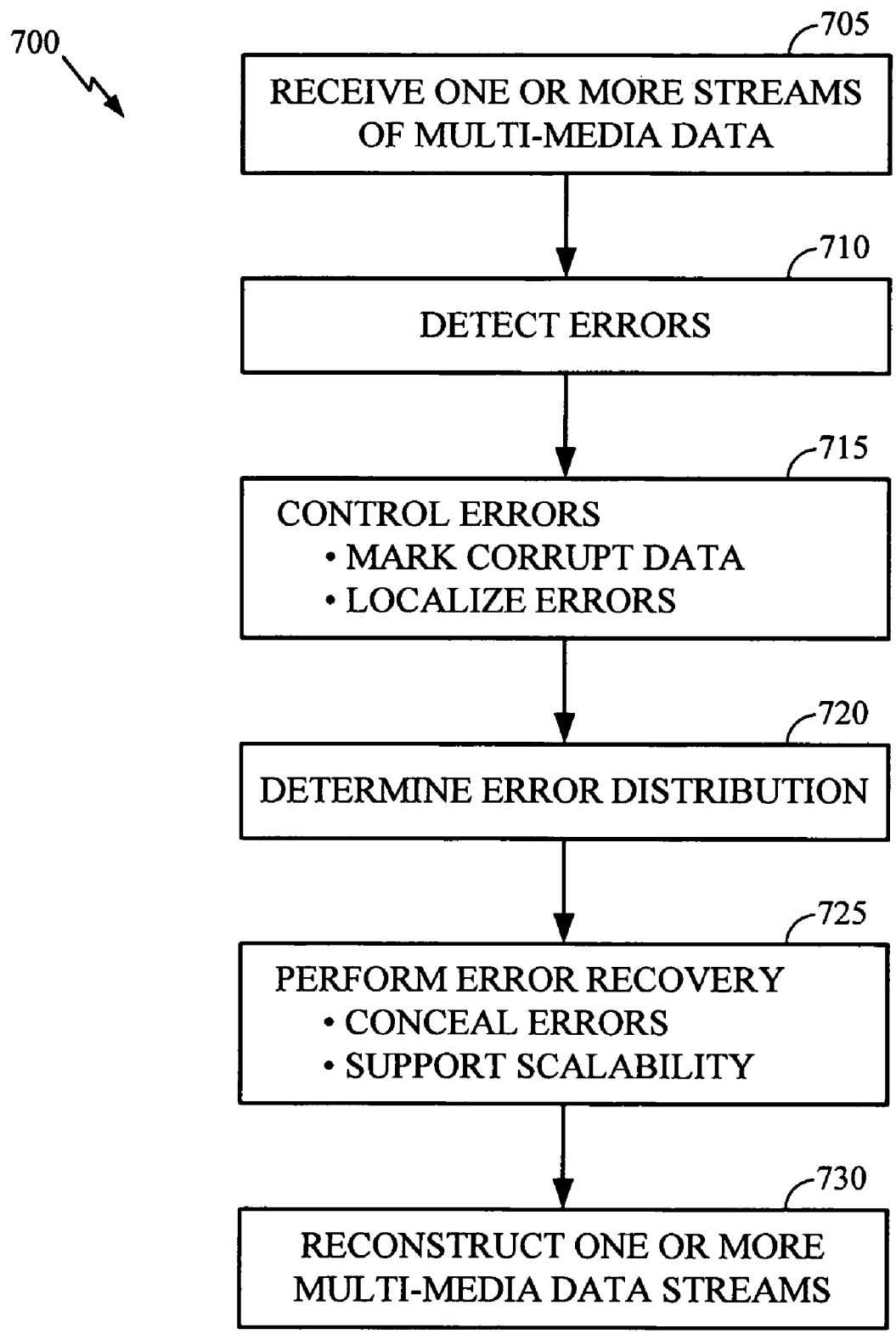
FIG. 7 shows a flowchart of a process for error recovery.

FIG. 6 shows a block diagram of an example of system of components that may be part of a multimedia receiver, e.g., reciever 24 shown in FIG. 1. System 600 is a multi-layer integration system for use in error recovery. FIG. 7 shows a flowchart of a process for error recovery that may be used by system 600. With reference to FIGS. 6 and 7, process 700 receives 705 one or more streams of multimedia data. Data streams may include video, audio, and/or closed caption text and others. The received one or more streams may be of encoded data. Encoded data may be transformed data, quantized data, compressed data or combinations thereof. Receiving means such as receiver 24 in FIG. 1A may receive 705 the one or more streams. In addition to receiving multiple streams of multimedia, each received stream may comprise multiple layers, e.g., a base layer and an enhancement layer. Receiver 24 may be a wireless or wired receiver or a combination.

Errors remaining in the bitstream are detected 710. The detected errors may comprise those errors remaining after lower layer error correction and detection protocols have corrected some of the errors that were introduced by transmission over a channel, e.g. wireless channel 26 or wired channel 28 of FIG. 1A. As discussed above, not all errors are correctable and any of the lower layer protocols may mark corrupt data and/or groups of data that contain errors. The lower layer protocols used to detect 710 errors may be implemented in a communication layer as discussed above. Communication layers may be one or a combination of a physical layer, a MAC layer (or Stream layer), or a transport layer, or a combination thereof. Detector means such as error detector 605 in FIG. 6 may perform the error detection 710. Error detector 605 may use any of various detection schemes known to those of skill in the art, e.g., Reed-Solomon and/or Turbo-code schemes as discussed above. Error detection may be due to a CRC failure in a Turbo-decoder. Error detection may be due to failure of a Reed-Solomon decoder.

Detected errors may be controlled 715 by several methods. Control 715 may comprise marking (or flagging) of corrupt data as was discussed above. Control 715 may comprise localizing errors by identifying groups of data, e.g., packets, blocks, slices, frames, macroblocks, sub-macroblocks, that contain the detected errors. Control 715 may be based on a transport layer protocol. Such a protocol may mark errors remaining by encoding one or more bits in a transport layer header for use by upper layers (see FIGS. 1B and 1C). Upper layers may use the transport layer header error indicators to further identify and/or localize upper layer packets that are made up of one or more corrupt transport layer packets, thereby further localizing the errors in upper layer bitstreams. Controlling means such as error controller 610 of FIG. 6 may perform the error control tasks.

An error distribution is determined 720. In one aspect, the error distribution is determined based on a sync layer protocol. The one or more bitstreams that were received 705, may be parsed at the sync layer. If the sync layer receives information from one of the lower, e.g, communication layers, marking corrupt data, it may be able to identify which portions of which bitstreams are corrupt. Having such information may enable a sync layer protocol to plan upper layer (e.g, an application layer) error concealment and/or error recovery strategies. Different strategies may be applied depending on the size of the corrupt data. The transport layer packets, that may be marked erroneous, may be combined into sync layer packets to be forwarded to the various application layer components depending on which bitstream they are part of. Transport layer packets may be of fixed length, and sync layer packets may be variable length. The sync layer may identify the error distribution by inserting data to identify which part of a variable length sync packet contains a corrupt transport layer packet. In addition to using the error control 715 information, a sync layer protocol may include further error detection methods. These error detection methods may include checking CRC's of sync layer packets. The determined error distribution may be further communicated to application layer components by inserting error markings into the parsed data packets. Determining means such as error distribution determiner 615 may determine 720 the error distribution.

Error recovery may be performed 725 on parts of the one or more encoded multimedia data streams. Error recovery may be based on application layer protocols. Application layer components may perform the error recovery. The application layer components may determine which type of error recovery to use based on information received from a sync layer, as discussed above. Error recovery may comprise one or a combination of temporal error concealment, spatial error concealment and frame rate up conversion (FRUC) as discussed above, as well as other methods. Concealing detected errors in the one or more multimedia data streams may be based on an application layer protocol. Error recovery may also support scalability of the one or more data streams. Scalability may include one or both of spatial or temporal scalability as discussed above. Error recovery means such as error recovery component 40 of FIG. 2A may perform error recovery 725. Error concealer means such as error concealer 620 may perform error concealment. Scalability means such as scalability components 42 of FIG. 2A and 620 of FIG. 6 may support scalability in performing error recovery 725.

Process 700 may include reconstruction 730 of the one or more bitstreams. Reconstruction 730 may comprise combining correctly received data with concealed data. Reconstruction may include reducing a frame rate (a form of temporal scalability) is the amount of error in a frame exceeds a threshold. Reconstruction may comprise electing not to decode or conceal or correct an enhancement layer (a form of SNR scalability). Application layer protocols may be the basis for reconstruction 730. Reconstruction means such as data stream reconstructor 630 may perform reconstruction 725. One or more elements may be added, rearranged or combined to system 600. One or more elements may be added, rearranged or combined to process 700.

Examples of the methods and apparatus described above include the following.

A method for decoding multimedia data that includes receiving a bitstream, performing error control decoding of the received bitstream, wherein error control decoding comprises identifying corrupt bits that are not corrected, passing the error control decoded bitstream including the identified corrupt bits to a decoder, replacing at least one of the identified bits, and decoding the error control decoded bitstream, including the replaced bits. In an aspect, the method further includes parsing the error control decoded bitstream into one or more symbols, and parsing information identifying the corrupt bits such that any symbols containing corrupt bits are identified as corrupt. In another aspect the method further includes constructing an error table containing the parsed information identifying the corrupt bits, where the error table contains information mapping the identified bits to positions in a sequence of video frames. In yet another aspect, the method further includes parsing the error control coded bitstream into a first parsed bitstream and a second parsed bitstream, where the first parsed bitstream is a base layer bitstream and the second parsed bitstream is an enhancement layer bitstream.

A method for decoding multimedia data that includes receiving a bitstream, performing error control decoding of the received bitstream, wherein error control decoding comprises identifying corrupt bits that are not corrected, passing the error control decoded bitstream including the identified corrupt bits to a decoder, replacing at least one of the identified bits by performing frame rate up conversion between a first frame and a second frame, and decoding the error control decoded bitstream.

Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of ordinary skill would further appreciate that the various illustrative logical blocks, modules, and algorithm steps described in connection with the examples disclosed herein may be implemented as electronic hardware, firmware, computer software, middleware, microcode, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed methods.

The various illustrative logical blocks, components, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples would be readily apparent to those skilled in the art, and the principles defined herein may be applied to other examples and additional elements may be added.

Thus, methods and apparatus to decode real-time streaming multimedia, utilizing bit corruption flagging information and corrupt data, in a decoder application, to perform intelligent error concealment and error correction of the corrupt data, have been described.

What is claimed is:

1. A method for multi-layer integration for use in error recovery, comprising:
    detecting a plurality of errors in a multimedia data based on a communication layer protocol by a multimedia device;
    identifying the detected errors as being not correctable by the communication layer protocol;
    determining an error distribution of the detected errors based on a sync layer protocol;
    determining a plurality of error markings from the error distribution based on the sync layer protocol;
    inserting the plurality of error markings into one or more packets of the multimedia data by the sync layer protocol; and
    concealing the detected errors in the multimedia data based on an application layer protocol using the plurality of error markings.

2. The method of claim 1, wherein the communication layer comprises either one or a combination of a physical layer, a MAC layer and a transport layer.

3. The method of claim 1, wherein identifying the detected errors comprises:
    localizing the detected errors.

4. An apparatus for multi-layer integration for use in error recovery, comprising:
    means for detecting a plurality of errors in a multimedia data based on a communication layer protocol;
    means for identifying the detected errors as being not correctable by the communication layer protocol;
    means for determining an error distribution of the detected errors based on a sync layer protocol;
    means for determining a plurality of error markings from the error distribution based on the sync layer protocol;
    means for inserting the plurality of error markings into one or more packets of the multimedia data by the sync layer protocol; and
    means for concealing the detected errors in the multimedia data based on an application layer protocol using the plurality of error markings.

5. The apparatus of claim 4, wherein the communication layer comprises either one or a combination of a physical layer, a MAC layer and a transport layer.

6. The apparatus of claim 4, wherein the means for identifying comprises:
    means for localizing the detected errors.

7. An apparatus for multi-layer integration for use in error recovery, comprising:
    a detector to detect a plurality of errors in a multimedia data based on a communication layer protocol;
    an identifier to identify the detected errors as being not correctable by the communication layer protocol;
    a determiner to:
        determine an error distribution of the detected errors based on a sync layer protocol;
        determine a plurality of error markings from the error distribution based on the sync layer protocol; and
        insert the plurality of error markings into one or more packets of the multimedia data by the sync layer protocol; and
    a concealer to conceal the detected errors in the multimedia data based on an application layer protocol using the plurality of error markings.

8. The apparatus of claim 7, wherein the communication layer comprises either one or a combination of a physical layer, a MAC layer and a transport layer.

9. The apparatus of claim 7, wherein the identifier localizes the detected errors.

10. A processor for multi-layer integration for use in error recovery, the processor configured to:
    detect a plurality of errors in a multimedia data based on a communication layer protocol;
    identify the detected errors as being not correctable by the communication layer protocol;
    determine an error distribution of the detected errors based on a sync layer protocol;
    determine a plurality of error markings from the error distribution based on the sync layer protocol;
    insert the plurality of error markings into one or more packets of the multimedia data by the sync layer protocol; and
    conceal the detected errors in the multimedia data based on an application layer protocol using the plurality of error markings.

11. The processor of claim 10, wherein the communication layer comprises either one or a combination of a physical layer, a MAC layer and a transport layer.

12. The processor of claim 10, wherein the processor is configured to localize the detected errors.

13. A computer readable medium embodying a method for multi-layer integration for use in error recovery, the method comprising:
    detecting a plurality of errors in a multimedia data based on a communication layer protocol;
    identifying the detected errors as being not correctable by the communication layer protocol;
    determining an error distribution of the detected errors based on a sync layer protocol;
    determining a plurality of error markings from the error distribution based on the sync layer protocol;
    inserting the plurality of error markings into one or more packets of the multimedia data by the sync layer protocol; and
    concealing the detected errors in the multimedia data based on an application layer protocol using the plurality of error markings.

14. The computer readable medium of claim 13, wherein the communication layer comprises either one or a combination of a physical layer, a MAC layer and a transport layer.

15. The computer readable medium of claim 13, wherein identifying the detected errors comprises:
    localizing the detected errors.

16. A method for multi-layer integration for use in error recovery, comprising:
    detecting a plurality of errors in a multimedia data based on a communication layer protocol by a multimedia device;

identifying the detected errors as being not correctable by the communication layer protocol;
determining an error distribution of the detected errors based on a sync layer protocol;
determining a plurality of error markings from the error distribution based on the sync layer protocol; and
concealing the detected errors in the multimedia data based on an application layer protocol using the plurality of error markings.

17. An apparatus for multi-layer integration for use in error recovery, comprising:
means for detecting a plurality of errors in a multimedia data based on a communication layer protocol;
means for identifying the detected errors as being not correctable by the communication layer protocol;
means for determining an error distribution of the detected errors based on a sync layer protocol;
means for determining a plurality of error markings from the error distribution based on the sync layer protocol; and
means for concealing the detected errors in the multimedia data based on an application layer protocol using the plurality of error markings.

18. An apparatus for multi-layer integration for use in error recovery, comprising:
a detector to detect a plurality of errors in a multimedia data based on a communication layer protocol;
an identifier to identify the detected errors as being not correctable by the communication layer protocol;
a determiner to:
determine an error distribution of the detected errors based on a sync layer protocol;
determine a plurality of error markings from the error distribution based on the sync layer protocol; and
a concealer to conceal the detected errors in the multimedia data based on an application layer protocol using the plurality of error markings.

19. A processor for multi-layer integration for use in error recovery, the processor configured to:
detect a plurality of errors in a multimedia data based on a communication layer protocol by a multimedia device;
identify the detected errors as being not correctable by the communication layer protocol;
determine an error distribution of the detected errors based on a sync layer protocol;
determine a plurality of error markings from the error distribution based on the sync layer protocol; and
conceal the detected errors in the multimedia data based on an application layer protocol using the plurality of error markings.

20. A computer readable medium embodying a method for multi-layer integration for use in error recovery, the method comprising:
detecting a plurality of errors in a multimedia data based on a communication layer protocol;
identifying the detected errors as being not correctable by the communication layer protocol;
determining an error distribution of the detected errors based on a sync layer protocol;
determining a plurality of error markings from the error distribution based on the sync layer protocol; and
concealing the detected errors in the multimedia data based on an application layer protocol using the plurality of error markings.

21. A method for use in multimedia data processing, comprising:
receiving an identification of a plurality of errors in an encoded multimedia data that are not correctable by a communication layer at a multimedia device, wherein the identification of the errors comprises a plurality of error markings inserted into one or more packets of the encoded multimedia data, and the plurality of error markings are determined from an error distribution;
performing error recovery of the encoded multimedia data using the received identification of errors at an application layer at the multimedia device; and
supporting scalability of the encoded multimedia data at the application layer at the multimedia device.

22. The method of claim 21, wherein the scalability comprises either one or both spatial and temporal scalability.

23. The method of claim 21, wherein the error recovery comprises either one or a combination of temporal error concealment, spatial error concealment and frame rate up conversion.

24. An apparatus for use in multimedia data processing, comprising:
means for receiving an identification of a plurality of errors in an encoded multimedia data that are not correctable by a communication layer, wherein the identification of the errors comprises a plurality of error markings inserted into one or more packets of the encoded multimedia data, and the plurality of error markings are determined from an error distribution;
means for performing error recovery of the encoded multimedia data using the received identification of errors at an application layer; and
means for supporting scalability of the encoded multimedia data at the application layer.

25. The apparatus of claim 24, wherein the scalability comprises either one or both spatial and temporal scalability.

26. The apparatus of claim 24, wherein the error recovery comprises either one or a combination of temporal error concealment, spatial error concealment and frame rate up conversion.

27. An apparatus for use in multimedia data processing, comprising:
a receiving component for receiving an identification of a plurality of errors in an encoded multimedia data that is are not correctable by a communication layer, wherein the identification of the errors comprises a plurality of error markings inserted into one or more packets of the encoded multimedia data. and the plurality of error markings are determined from an error distribution;
an error recovery component to perform error recovery of the encoded multimedia data using the received identification of errors at an application layer; and
a scalability component to support scalability of the encoded multimedia data at the application layer.

28. The apparatus of claim 27, wherein the scalability comprises either one or both spatial and temporal scalability.

29. The apparatus of claim 27, wherein the error recovery comprises either one or a combination of temporal error concealment, spatial error concealment and frame rate up conversion.

30. A processor for use in multimedia data processing, the processor configured to:
receive an identification of a plurality of errors in an encoded multimedia data that are not correctable by a communication layer, wherein the identification of the errors comprises a plurality of error markings inserted into one or more packets of the encoded multimedia data, and the plurality of error markings are determined from an error distribution;

perform error recovery of the encoded multimedia data using the received identification of errors at an application layer; and support scalability of the encoded multimedia data at the application layer.

31. The processor of claim 30, wherein the scalability comprises either one or both spatial and temporal scalability.

32. The processor of claim 30, wherein the error recovery comprises either one or a combination of temporal error concealment, spatial error concealment and frame rate up conversion.

33. A computer readable medium embodying a method for use in multimedia data processing, the method comprising:

receiving an identification of a plurality of errors in an encoded multimedia data that are not correctable by a communication layer, wherein the identification of the errors comprises a plurality of error markings inserted into one or more packets of the encoded multimedia data. and the plurality of error markings are determined from an error distribution;

performing error recovery of the encoded multimedia data using the received identification of errors at an application layer; and supporting scalability of the encoded multimedia data at the application layer.

34. The computer readable medium of claim 33, wherein the scalability comprises either one or both spatial and temporal scalability.

35. The computer readable medium of claim 33, wherein the error recovery comprises either one or a combination of temporal error concealment, spatial error concealment and frame rate up conversion.

36. A method for use in multimedia stream processing, comprising:

receiving multiple streams of encoded multimedia data at a multimedia device;

detecting a plurality of errors in the multiple streams of encoded multimedia data based on a communication layer protocol;

identifying the errors as being not correctable by the communication layer protocol;

determining an error distribution of the errors based on a sync layer protocol;

determining a plurality of error markings from the error distribution based on the sync layer protocol;

inserting the plurality of error markings into one or more packets of the multimedia data by the sync layer protocol;

performing error recovery on the errors using the plurality of error markings based on an application layer protocol; and reconstructing the multimedia data from the multiple streams based on the application layer protocol.

37. The method of claim 36, wherein the error recovery comprises either one or a combination of temporal error concealment, spatial error concealment and frame rate up conversion.

38. An apparatus for use in multimedia stream processing, comprising:

means for receiving multiple streams of encoded multimedia data;

means for detecting a plurality of errors in the multiple streams of encoded multimedia data based on a communication layer protocol;

means for identifying the errors as being not correctable by the communication layer protocol;

means for determining an error distribution of the errors based on a sync layer protocol;

means for determining a plurality of error markings from the error distribution based on the sync layer protocol;

means for inserting the plurality of error markings into one or more packets of the multimedia data by the sync layer protocol;

means for performing error recovery on the errors using the plurality of error markings based on an application layer protocol; and means for reconstructing the multimedia data from the multiple streams based on the application layer protocol.

39. The apparatus of claim 38, wherein the error recovery comprises either one or a combination of temporal error concealment, spatial error concealment and frame rate up conversion.

40. An apparatus for use in multimedia stream processing, comprising:

a receiver to receive multiple streams of encoded multimedia data;

a detector to detect a plurality of errors in the multiple streams of encoded multimedia data based on a communication layer protocol;

an identifier to identify the errors as being not correctable by the communication layer protocol;

a determiner to:
    determine an error distribution of the errors based on a sync layer protocol;
    determine a plurality of error markings from the error distribution based on the sync layer protocol; and
    insert the plurality of error markings into one or more packets of the multimedia data by the sync layer protocol;

an error recovery component to perform error recovery on the errors using the plurality of error markings based on an application layer protocol; and a reconstructor to reconstruct the multimedia data from the multiple streams based on the application layer protocol.

41. The apparatus of claim 40, wherein the error recovery comprises either one or a combination of temporal error concealment, spatial error concealment and frame rate up conversion.

42. A processor for use in multimedia stream processing, the processor configured to:

receive multiple streams of encoded multimedia data;

detect a plurality of errors in the multiple streams of encoded multimedia data based on a communication layer protocol;

identify the errors as being not correctable by the communication layer protocol;

determine an error distribution of the errors based on a sync layer protocol;

determine a plurality of error markings from the error distribution based on the sync layer protocol;

insert the plurality of error markings into one or more packets of the multimedia data by the sync layer protocol;

perform error recovery on the errors using the plurality of error markings based on an application layer protocol; and reconstruct the multimedia data from the multiple streams based on the application layer protocol.

43. The processor of claim 42, wherein the error recovery comprises either one or a combination of temporal error concealment, spatial error concealment and frame rate up conversion.

44. A computer readable medium embodying a method for use in multimedia stream processing, the method comprising:

receiving multiple streams of encoded multimedia data;

detecting a plurality of errors in the multiple streams of encoded multimedia data based on a communication layer protocol;

identifying the errors as being not correctable by the communication layer protocol;

determining an error distribution of the errors based on a sync layer protocol;

determining a plurality of error markings from the error distribution based on the sync layer protocol;

inserting the plurality of error markings into one or more packets of the multimedia data by the sync layer protocol;

performing error recovery on the errors using the plurality of error markings based on an application layer protocol; and reconstructing the multimedia data from the multiple streams based on the application layer protocol.

45. The computer readable medium of claim 44, wherein the error recovery comprises either one or a combination of temporal error concealment, spatial error concealment and frame rate up conversion.

* * * * *